United States Patent
Lee (10) Patent No.: US 6,709,964 B2
(45) Date of Patent: Mar. 23, 2004

(54) SEMICONDUCTOR DEVICE AND MANUFACTURING METHOD USING A STRESS-RELIEVING FILM ATTACHED TO SOLDER JOINTS

(75) Inventor: Jin Hyuk Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/944,260

(22) Filed: Aug. 30, 2001

(65) Prior Publication Data

US 2003/0207489 A1 Nov. 6, 2003

Related U.S. Application Data

(62) Division of application No. 09/496,313, filed on Feb. 1, 2000.

(30) Foreign Application Priority Data

Jul. 21, 1999 (KR) ......................................... 1999-29522

(51) Int. Cl.$^7$ .................. H01L 21/44; H01L 21/48; H01L 23/48; H01L 29/40
(52) U.S. Cl. ...................... 438/612; 438/613; 438/108; 257/737; 257/772; 257/780; 257/782
(58) Field of Search ............... 438/108, 612, 438/613, 106; 257/737, 738, 772, 779, 780, 782

(56) References Cited

U.S. PATENT DOCUMENTS

| | | | | |
|---|---|---|---|---|
| 4,878,611 A | * | 11/1989 | LoVasco et al. | 228/180.22 |
| 4,897,918 A | * | 2/1990 | Osaka et al. | 29/830 |
| 4,956,694 A | | 9/1990 | Eide | 357/74 |
| 5,019,943 A | | 5/1991 | Fassbender et al. | 361/396 |
| 5,120,678 A | | 6/1992 | Moore et al. | 437/183 |
| 5,174,766 A | * | 12/1992 | Yoshizawa et al. | 439/91 |
| 5,207,585 A | * | 5/1993 | Byrnes et al. | 439/66 |
| 5,438,223 A | * | 8/1995 | Higashi et al. | 257/774 |
| 5,509,203 A | * | 4/1996 | Yamashita | 29/879 |
| 5,535,101 A | * | 7/1996 | Miles et al. | 367/808 |
| 5,553,089 A | | 9/1996 | Seki et al. | 372/43 |
| 5,578,527 A | | 11/1996 | Chang et al. | 437/209 |
| 5,600,541 A | | 2/1997 | Bone et al. | 361/707 |
| 5,612,570 A | | 3/1997 | Eide et al. | 257/686 |
| 5,659,203 A | * | 8/1997 | Call et al. | 257/778 |
| 5,738,531 A | | 4/1998 | Beaman et al. | 439/71 |
| 5,781,413 A | | 7/1998 | Howell et al. | 361/777 |
| 5,818,107 A | | 10/1998 | Pierson et al. | 257/723 |
| 5,834,162 A | | 11/1998 | Malba | 430/317 |
| 5,849,609 A | * | 12/1998 | Chun | 438/125 |
| 5,895,976 A | | 4/1999 | Morrell et al. | 257/778 |
| 5,981,312 A | | 11/1999 | Farquhar et al. | 438/112 |
| 6,016,013 A | * | 1/2000 | Baba | 257/778 |
| 6,034,333 A | | 3/2000 | Skipor et al. | 174/260 |
| 6,050,832 A | | 4/2000 | Lee et al. | 439/91 |
| 6,144,101 A | | 11/2000 | Akram | 257/778 |
| 6,148,900 A | * | 11/2000 | Yamasaki et al. | 164/80 |
| 6,180,504 B1 | * | 1/2001 | Farnworth et al. | 438/612 |
| 6,201,192 B1 | | 3/2001 | Wille et al. | 174/255 |
| 6,249,131 B1 | * | 6/2001 | Nangle | 324/754 |
| 6,260,264 B1 | | 7/2001 | Chen et al. | 29/832 |
| 6,291,895 B1 | * | 9/2001 | Taniguchi et al. | 257/782 |
| 6,376,279 B1 | * | 4/2002 | Kwon et al. | 438/113 |

* cited by examiner

Primary Examiner—Matthew Smith
Assistant Examiner—Chuong Anh Lu
(74) Attorney, Agent, or Firm—Harness, Dickey & Pierce, P.L.C.

(57) ABSTRACT

A semiconductor device package includes an integrated circuit chip having a plurality of chip pads thereon, and a plurality of ball pads rerouted from the chip pads, and a substrate including a plurality of substrate pads thereon. Solder joints, each physically and electrically connecting a ball pad and a substrate pad, are between the to package and the substrate. A stress-relieving film, which can be a polyimide or other dielectric film, lies away front amend between the package and the substrate. A plurality of via holes or metal regions are in the film at positions corresponding to the solder joints. The solder balls are formed on the package and the substrate or only on the package. The solder joints are through the via holes or attached to the metal regions. The stress-relieving film thus attaches to the solder joints and distributes stress in the solder joints over the stress-relieving film to reduce the probability of cracking the solder joints. The stress-relieving film does not contact the package and the substrate and thereby avoids causing interface delamination.

12 Claims, 8 Drawing Sheets

SEMICONDUCTOR DEVICE AND MANUFACTURING METHOD USING A STRESS-RELIEVING FILM ATTACHED TO SOLDER JOINTS

CROSS REFERENCE TO RELATED APPLICATION

This application is a division of and claims priority from U.S. patent application Ser. No. 09/496,313, filed Feb. 1, 2000, entitled, "Semiconductor Device And Manufacturing Method Using A Stress-Relieving Film Attached To Solder Joints" which claims priority from Korean Patent Application Number 99-29522, filed Jul. 21, 1999.

BACKGROUND OF THE INVENTION

1. Field of the Invention

The present invention generally relates to a semiconductor device and a manufacturing method thereof. More particularly, the present invention relates to solder joints that physically and electrically connect a package and a substrate.

2. Description of the Related Arts

The trends for semiconductor integrated circuit (IC) chips have been toward higher density of devices, higher speed, smaller area, and thinner thickness. In keeping with these trends, packages for IC chips therein have moved from pin insert or through hole mount packages to surface mount packages to improve the mounting density on a substrate or circuit board. A Chip Size Package (CSP), for example, permits high mounting density. The CSP offers many advantages. The most obvious advantage is size of the CSP, which is nearly that of the bare chip.

A Wafer Level CSP (WL-CSP) is a kind of the CSP, where packaging processes are predominantly performed on wafers rather than individual chips. Each chip has an array of terminals, typically solder balls, on a face of the chip. The solder balls are rerouted or redistributed from associated chip pads during a wafer fabrication process. Flip chip assembly can attach the chip or die of the WL-CSP to a substrate or circuit board via the solder balls.

The mounting structure using the solder balls has reliability problems at the solder joints. As well known in the art, the chip and the substrate have dissimilar Coefficients of the Thermal Expansion (CTEs). Due to the dissimilarity of the CTEs, changes in temperature create shearing stresses on the solder joints. The shearing stresses often cause cracks or delamination at the solder joints. Temperature Cycling (T/C) testing, which periodically varies the temperature of a chip within a temperature range, for example, from −25° C. to 125° C., can identify problems or defects at the solder joints.

One approach to reducing the reliability problems is the underfill encapsulation method. This method uses a liquid resin encapsulant on the substrate around the chip to fill a gap between the package and the substrate after the flip chip assembly. The underfill encapsulation improves the reliability of the solder joints. However, the underfill encapsulation can introduce new failures. Further, the underfill encapsulation requires additional process steps and thereby increases production cost.

Figure 1A:
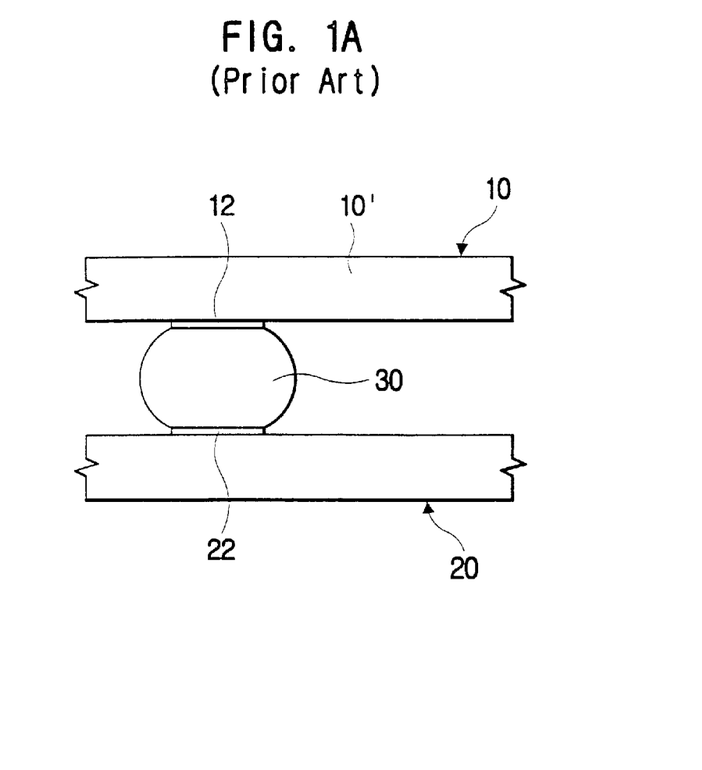
FIGS. 1A and 1B illustrate a failure of a conventional solder joint.
Figure 1B:
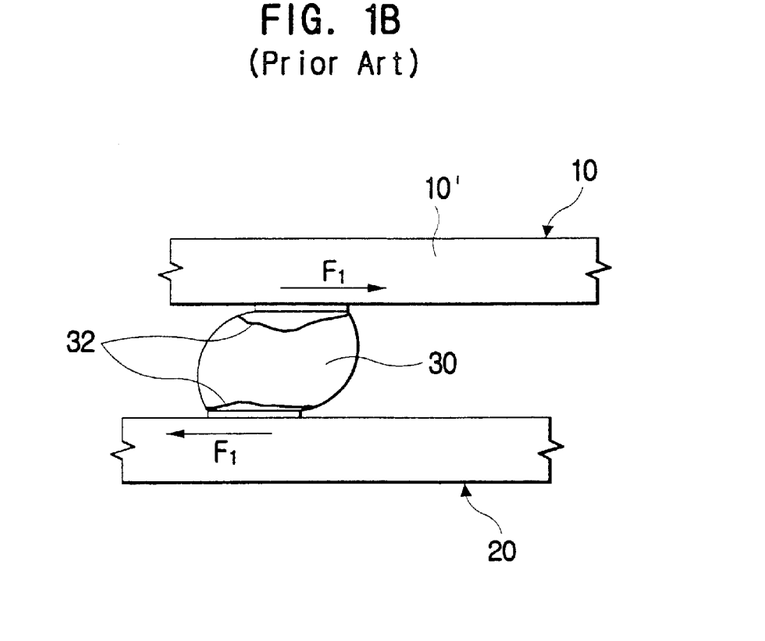
Figure 2A:
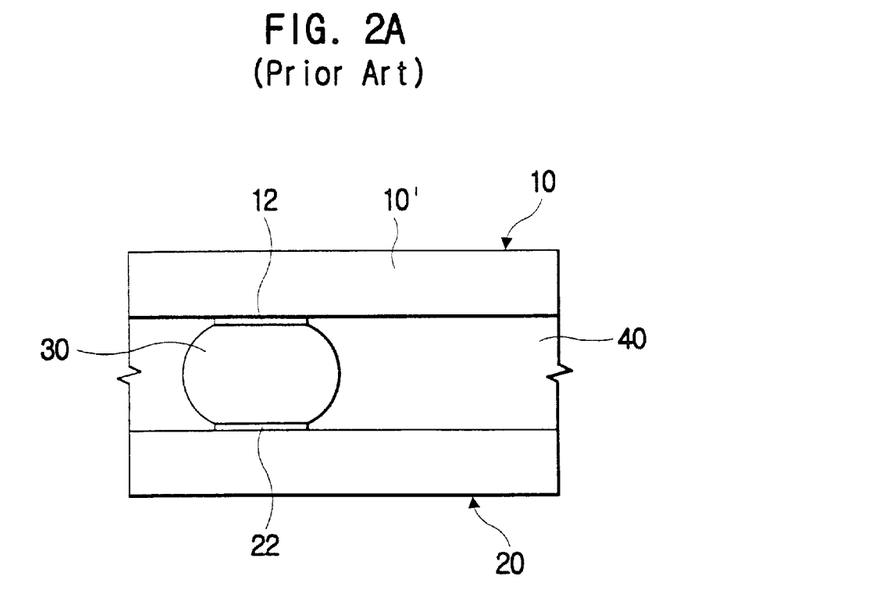
FIGS. 2A and 2B illustrate how an underfill encapsulation prevents the solder joint failure.
Figure 2B:
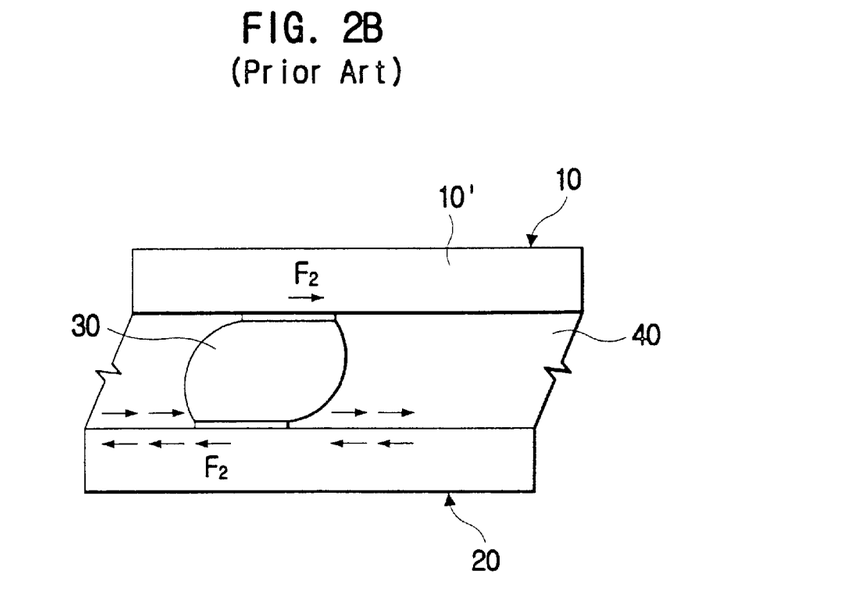

FIGS. 1A and 1B illustrate how a solder joint can develop cracks, and FIGS. 2A and 2B illustrate how the underfill encapsulation prevents such cracks. As shown in FIG. 1A, a solder joint 30 bonds a chip size package 10 to a substrate 20. The solder joint 30 is formed by bonding a solder ball on a ball pad 12 to a substrate pad 22 of the substrate 20. Alternatively, the solder ball may initially be on the substrate pad 22 and then bonded to the ball pad 12.

The solder joint 30 cracks easily. Due to the dissimilarity of the CTEs of the chip 10' and the substrate 20, a shearing stress $F_1$ acts on the top and bottom of the solder joint as shown in FIG. 1B, and the resulting deformation can exceed an elastic range of the solder joint. This deformation is often referred to as a "plastic strain". Repeated changes in the temperature cause the plastic strain to accumulate on the solder joint 30 until the plastic strain exceeds the critical point of the solder, and the solder joint cracks. The crack is often called a "fatigue crack".

Figure 3:
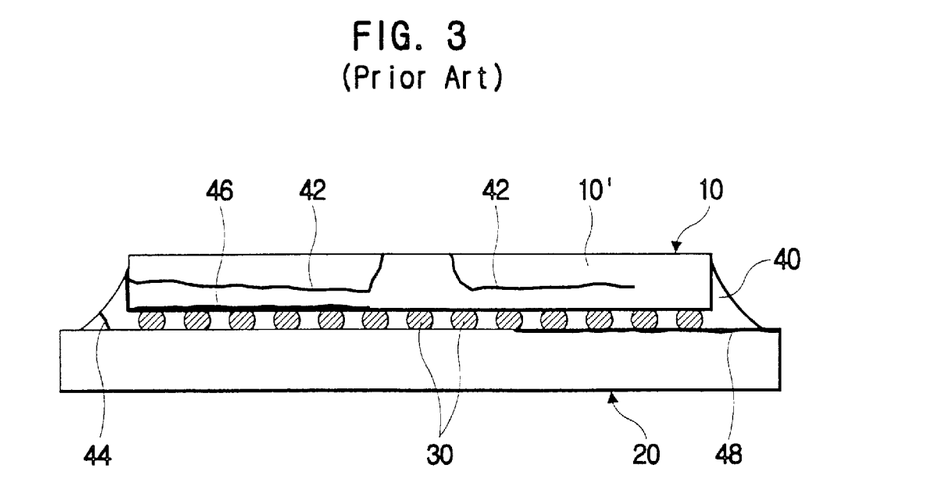
FIG. 3 illustrates a failure that the underfill encapsulation causes.

As shown in FIG. 2A, if the gap between the package 10 and the substrate 20 is filled, the shearing stress is distributed over the underfill encapsulant 40. Therefore, the shearing stress $F_2$ causing the deformation of the solder joint 30 is smaller, and the deformation of the solder joint 30 typically remains within the elastic range. (This deformation is commonly referred to as an "elastic strain".) The plastic strain, if any, is insignificant. Although the temperature change is repeated, the deformation of the solder joint 30 is not enough to crack the solder joint 30. Although the underfill encapsulation improves the reliability of the solder joints, the underfill encapsulation can introduce new failures. FIG. 3 illustrates how an underfill encapsulant 40 such as an epoxy resin not only fills the gap between the package 10 and the substrate 20, but also supports the side surface of the package 10. Therefore, the underfill encapsulant 40 fixes the package 10 to the substrate 20. If the solder joint with the underfill encapsulant undergoes the severe temperature change, the dissimilarity of the CTEs can warp the package 10 and the substrate 20. Occasionally, this warping causes damage such as a crack 42 in the chip 10', a crack 44 in the underfill encapsulant 40, a delamination 46 at the interface between the package 10 and the underfill encapsulant 40, or a delamination 48 at the interface between the underfill encapsulant 40 and the substrate 20.

SUMMARY OF THE INVENTION

According to an aspect of the present invention, a structure and a fabrication method for solder joints in chip size packages reduce fabrication costs, improve the reliability of the solder joints, and prevent other failures.

One embodiment of the present invention is a semiconductor device package that includes an integrated circuit chip, a substrate, a plurality of solder joints, and a stress-relieving film. The integrated circuit chip has a plurality of chip pads and a plurality of ball pads rerouted from the chip pads. The substrate includes a plurality of substrate pads thereon, each substrate pad corresponding to a respective one of the ball pads. Each of the solder joints physically and electrically connects a ball pad to the corresponding substrate pad. The stress-relieving film lies away from and between the package and the substrate. The stress-relieving film is joined to the solder joints to distribute stress in the solder joints over the stress-relieving film.

In one embodiment, the stress-relieving film is a polyimide film and has a plurality of via holes or a plurality of intervenient metal regions corresponding to the solder joints. The solder joints are formed through the via holes or by attaching solder balls to the intervenient metal regions.

In accordance with another aspect, the present invention provides a method for manufacturing a semiconductor device. One embodiment of the manufacturing method includes: (A) providing a package having a plurality of solder balls on the respective ball pads, (B) providing a substrate including a plurality of substrate pads thereon, each substrate pad corresponding to a respective one of the ball pads, (C) positioning a stress-relieving film away from and between the package and the substrate, and (D) reflowing the solder balls to form a plurality of solder joints. Each solder ball physically and electrically connects the corresponding ball and substrate pads. The stress-relieving film attaches to the plurality of solder joints and distributes stress away from the solder joints.

The stress-relieving film can include a plurality of via holes or a plurality of intervenient metal regions, and the solder joints pass through the via holes or attach to the intervenient metal regions. Solder balls can also be formed on the corresponding substrate pads, and reflowing the solder balls on the substrate pads and the solder balls on the ball pads forms the solder joints. In this case, the stress-relieving film is on the substrate, with each solder ball of the substrate pad aligned with a corresponding one of the via holes or metal regions. The package is placed on the stress-relieving film so that each solder ball on the ball pad is aligned with a corresponding one of the via holes or metal pads. When the substrate is without the solder balls on the substrate pads, a fixing means fixes or hold the stress-relieving film away from the substrate by a designated distance.

BRIEF DESCRIPTION OF THE DRAWINGS

The features, aspects, and advantages of the present invention will become better understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 4A:
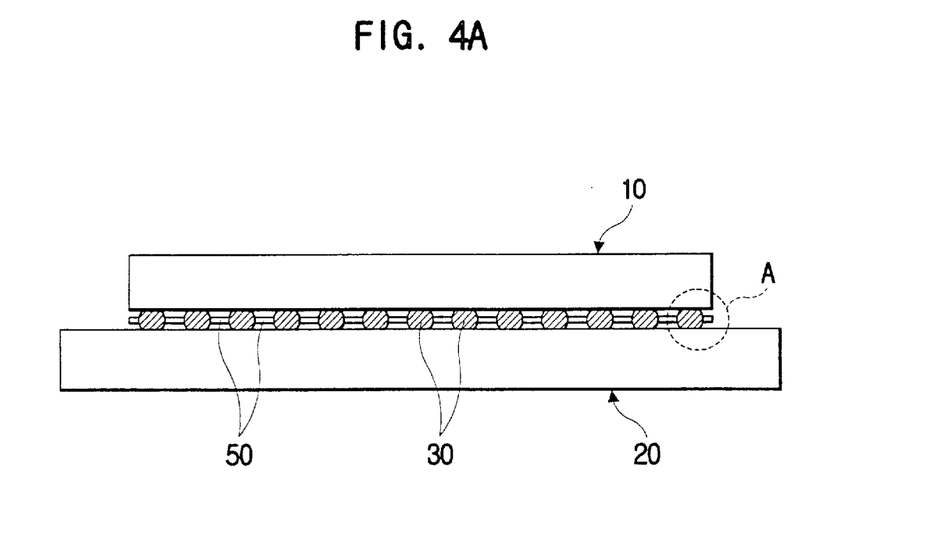
FIGS. 4A, 4B, and 4C show the structure of solder joints for chip size packages according to an embodiment of the present invention.
Figure 4B:
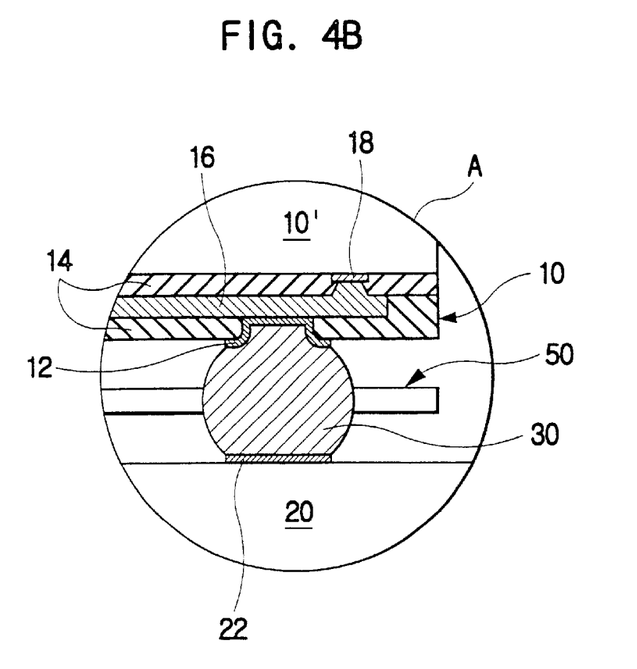
Figure 4C:
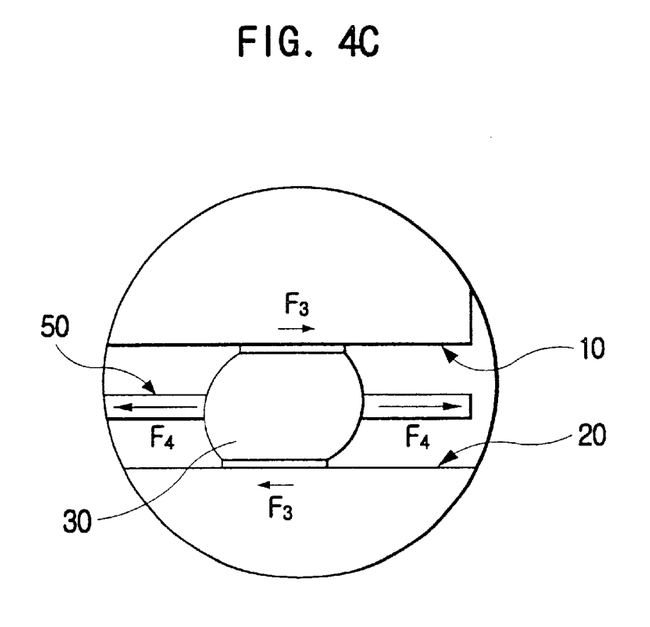

FIGS. 4A, 4B, and 4C show the structure of the solder joints for a chip size package according to an embodiment of the present invention. Particularly, FIG. 4A is a side view showing an assembly where a stress-relieving film 50 attaches to solder joints 30 between a package 10 and a substrate 20. FIG. 4B is an enlarged view of a part "A" in FIG. 4A. FIG. 4C depicts how the stress-relieving film reduces stress and prevents solder joint failures.

With reference to FIG. 4A, the solder joints 30 bond the package 10 to the substrate 20, and the stress-relieving film 50 is between the package 10 and the substrate 20. In an exemplary embodiment, package 10 is a conventional chip scale package, and substrate 20 is a conventional circuit board.

FIG. 4B depicts the structure of one of the solder joints 30 in the exemplary embodiment. The chip size package 10 is a WL-CSP having a rerouting metal pattern 16 on the surface of a chip 10'. Rerouting metal pattern 16 connects the chip pads 18 to the ball pads 12. A dielectric layers 14 separates the rerouting metal pattern 16 from the chip 10' except where the pattern 16 contacts the chip pads 18. The dielectric layer 14 also covers the rerouting metal pattern 16 except over the ball pads 12. A solder ball is formed on each ball pad 12, and the solder joint 30 is formed at least partially from the solder ball. The solder balls serve as the external terminals the package 10 as would the external connection pins of a pin insert type package or the outer leads of a surface mount type package. A rerouting step during a wafer fabrication process forms rerouting metal pattern 16, the ball pads 12, and the solder balls on the surface of the chip 10'.

A technique commonly known as Flip Chip Bonding (FCB) turns the chip 10' so that its active surface faces the substrate 20. The stress-relieving film is placed between the package 10 and the substrate 20 before a reflow process forms the solder joints 30 between the ball pads 12 and the substrate pads 22. The solder joints 30 physically connect the package 10 to the substrate 20 and provide electrical paths between the chip 10' and the substrate 20. After this bonding, the chip 10' remains separated from the substrate 20 by the height of the solder joints 30, and the stress-relieving film 50 lies away from the chip size package 10 and the substrate 20 by a designated distance. The reflow process attaches all of the solder joints 30 to the stress-relieving film 50, so that the stress-relieving film 50 supports the sides of each solder joint 30. Preferably, the stress-relieving film 50 is a polyimide film having a low CTE and high elastic coefficient.

The stress-relieving film 50 improves the reliability of the solder joints 30. FIG. 4C illustrates how the stress-relieving film 50 distributes the stress created on the solder joint 30 due to the temperature change over the stress-relieving film 50 ($F_4$) and thereby decreases the shearing stress ($F_3$) on the top and the bottom ends of the solder joint 30. The stress-relieving film 50 has almost the same size as the package 10, that is, the rerouted chip 10', and is joined to all the solder joints 30. Accordingly, the stress on the solder joints 30 is equally distributed over the stress-relieving film 50. One aspect of the invention is that the stress-relieving film 50 supports only the side surfaces of each solder joints 30 and does not contact the rerouted chip 10' of the package 10 or the substrate 20. The stress-relieving film 50 also has a self-elasticity. Accordingly, the stress-relieving film 50 effectively prevents several problems that arise from the conventional underfill encapsulation. In particular, expansion or contraction of the package 10, the substrate 20, or the stress-relieving film 50 does not cause chip cracks or interface delamination.

Figure 7:
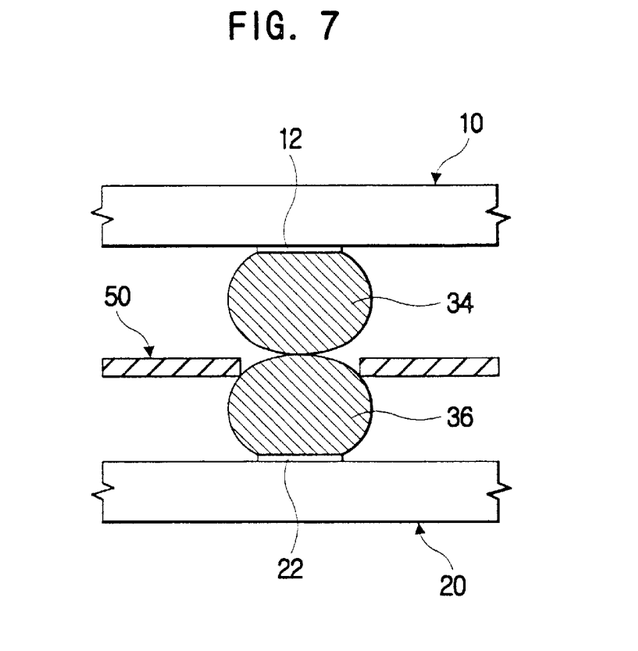

In alternative embodiments, the stress-relieving film 50 includes a plurality of via holes (52 in FIG. 5) or a plurality of intervenient metal regions (56 in FIG. 10) corresponding to the solder joints 30. Additionally, the solder balls 34 can be only on the ball pads 12 of the package 10 (FIG. 9), or the solder balls 34 and 36 can be on both the ball pads 12 and on the substrate pads 22, respectively (FIGS. 7 and 11). The stress-relieving film having via holes is suitable when the solder balls are on both the ball pads and on the substrate pads and when the solder balls are only on the ball pads.

Figure 5:
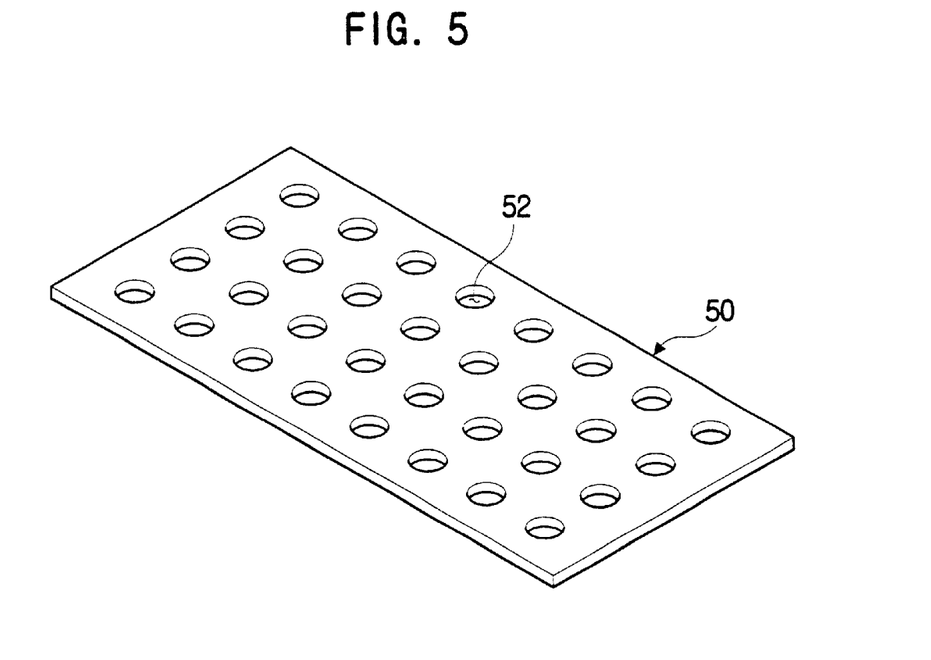
FIGS. 5, 6, 7, and 8 illustrate a solder joint fabrication method in accordance with an embodiment of the invention.

FIGS. 5 through 8 illustrate a solder joint fabrication method capable of forming the structure of FIGS. 4A, 4B, and 4C. FIG. 5 depicts the stress-relieving film 50 that includes a plurality of via holes 52. As described above, the stress-relieving film 50 is a dielectric film such as a polyimide. The via holes 52 pass through the stress-relieving film 50 and have positions corresponding to the ball pads (12 in FIG. 7) of the package 10 and the substrate pads (22 in FIG. 7) of the substrate 20. A diameter of the via hole 52 depends on the diameter of the solder joint (30 in FIG. 8) and the joining method.

Figure 6:
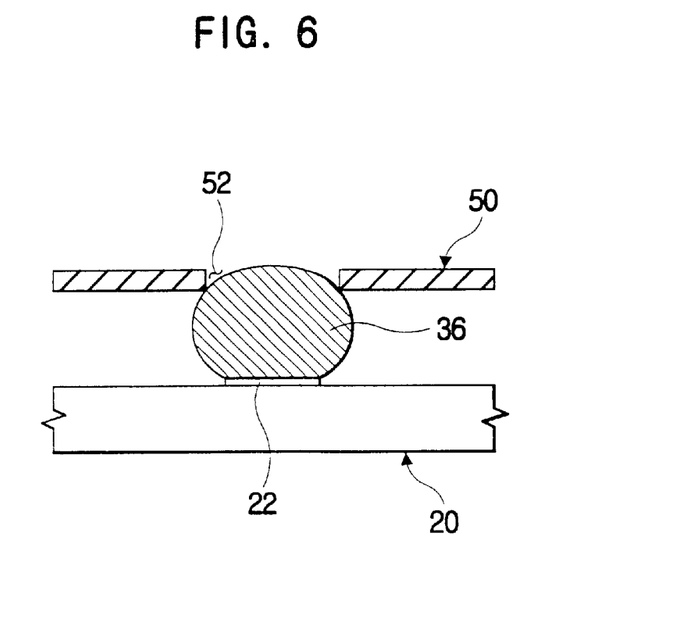

As shown in FIG. 6, the stress-relieving film 50 is initially on the solder balls 36 of the substrate 20. For positioning the stress-relieving film 50 on the solder balls 36, the diameter of each via hole 52 is smaller than that of the corresponding solder ball 36. If it is possible to mount the stress-relieving film SO on the solder balls 36, an additional fixing means or aligning means is not required.

As shown in FIG. 7, the package 10 with its active surface down is placed on the stress-relieving film 50 so that the solder balls 34 of the package 10 are opposite to the substrate 20. Herein, each of the solder balls 34 of the package 10 is aligned with a corresponding one of the via holes 52. To more precisely align the package 10 and the stress-relieving film 50, the stress-relieving film 50 may include alignment marks. When the package 10 is aligned and placed on the stress-relieving film 50, the solder balls 34 of the package 10 contact the solder balls 36 of the substrate 20 through the via holes 52.

Figure 8:
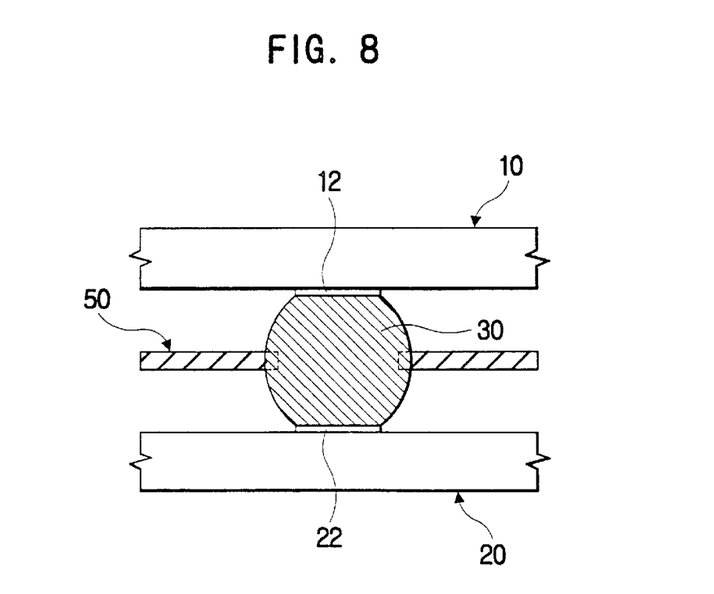

After a conventional reflow process, the solder balls 34 and 36 join to form the solder joints 30 which extend through the via holes 52. FIG. 8 shows the solder joint 30, which same basic shape as that of the solder joints FIGS. 4A, 4B, and 4C. Proper selection of the diameters of the solder balls 34 and 36 and via holes 52 results in the solder joints overlapping and being attached to the stress-relieving film 50. The stress-relieving 50 thus attaches to and supports the sides of each solder joint 30. As shown in FIG. 8, since the diameter of the solder joint 30 is greater than the diameter of the via hole (52 in FIG. 6), the stress-relieving film 50 firmly attaches to all the solder joints 30 and more steadily supports the solder joints 30.

Figure 9:
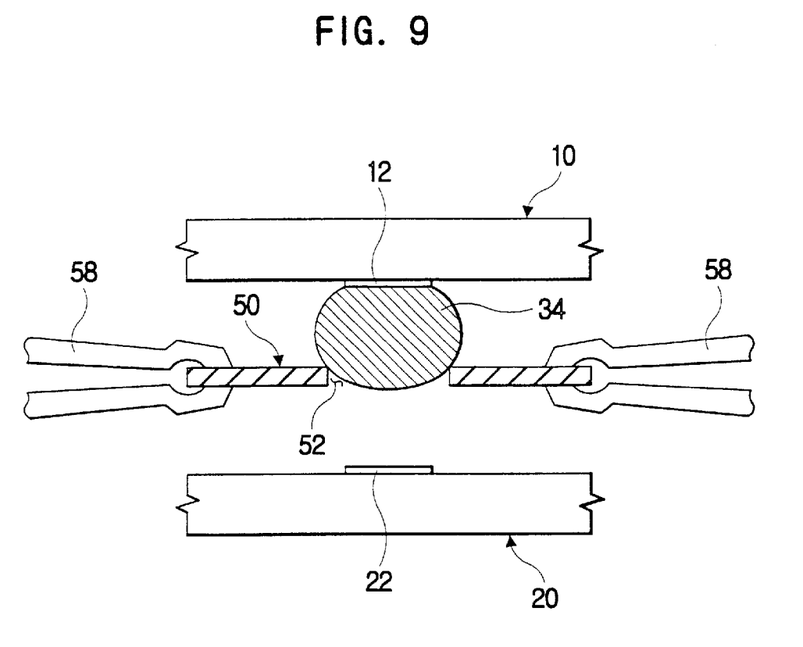
FIGS. 9 illustrates another embodiment of the solder joint fabrication method.

FIG. 9 illustrates another example of a solder joint fabrication method capable of forming the structure of the solder joint of FIGS. 4A, 4B, and 4C. The solder joint fabrication method of FIG. 9 uses the stress-relieving film 50 having the via holes 52 as shown in FIG. 5, but the solder balls 34 are only on the package 10. The solder balls (36 in FIG. 6) being absent from the substrate 20 are not available for aligning the stress-relieving film 50 with the substrate 20. Accordingly, another method for fixing and aligning the stress-relieving film 50 is required. For example, a fixing means 58 such as tweezers holds the stress-relieving film 50 above the substrate 20, and alignment marks on the stress-relieving film 50 or the substrate 20 facilitate alignment.

With the stress-relieving film 50 lying away from the substrate 20 by a designated distance, the package 10 is placed on the stress-relieving film 50. The solder balls 34 of the package 10 are aligned with the via holes 52 of the stress-relieving film 50. A reflow process melts the solder balls 34 causing the solder balls to extend through via holes 52 and contact the substrate pads 22 on the substrate 20.

Another embodiment of the present invention uses a stress-relieving film having the via holes filled with metal. In this embodiment, the solder balls need to be on both the substrate pads of the substrate and the ball pads of the package. The intervenient metal regions in the stress-relieving film improve the supporting force of the stress-relieving film during the bonding process.

Figure 10:
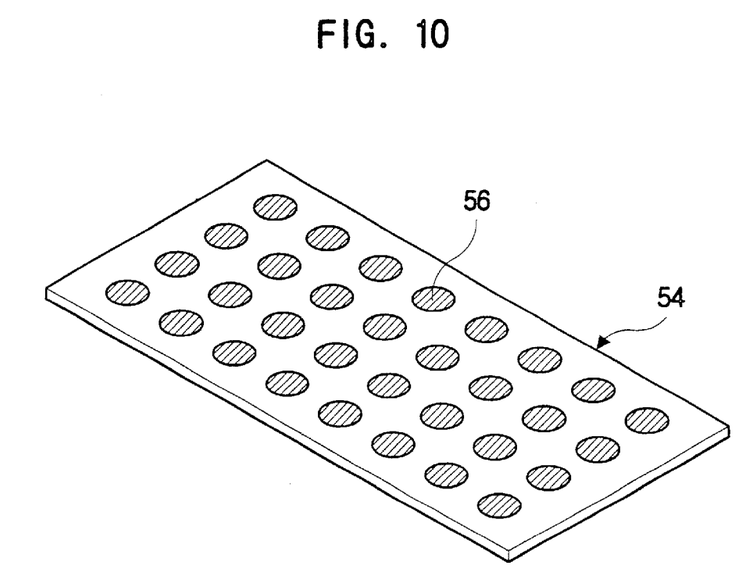
FIGS. 10, 11, and 12 illustrate a structure and a fabrication method for solder joints according to another embodiment of the present invention.
Figure 11:
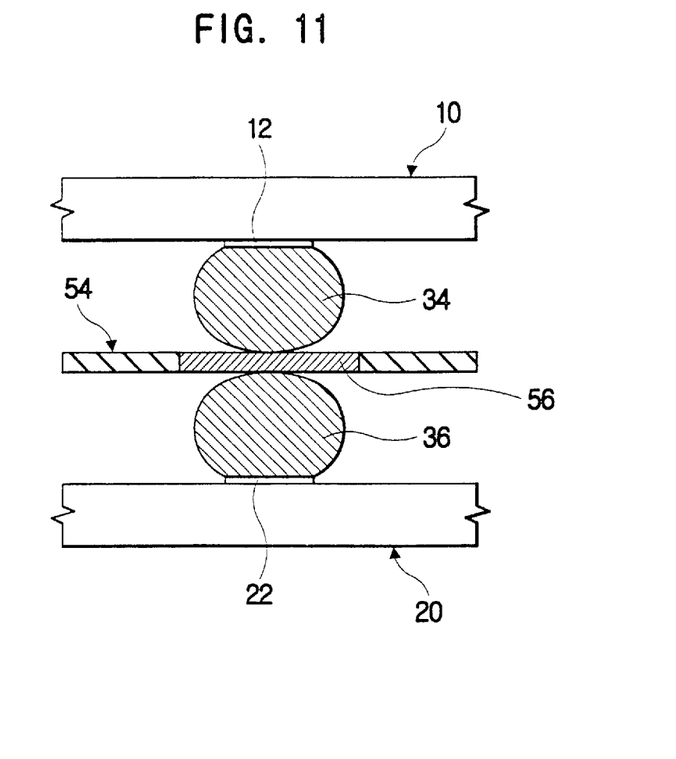
Figure 12:
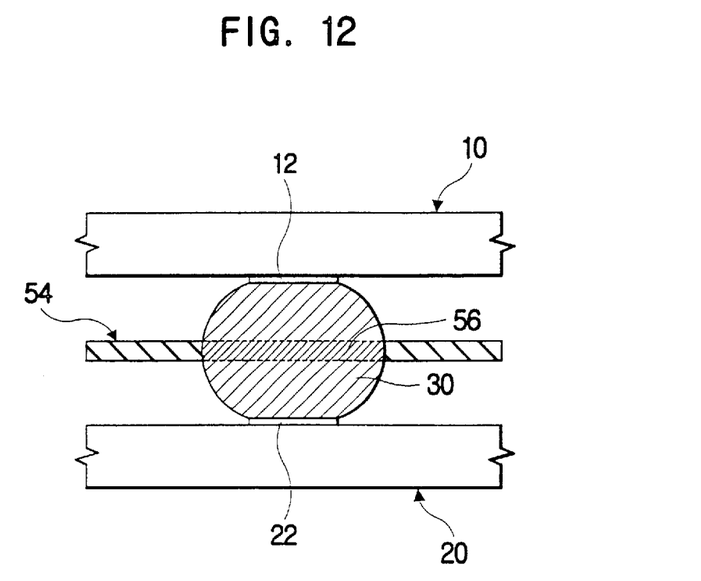

FIG. 10 shows a stress-relieving film 54 including a plurality of the intervenient metal regions 56. The stress-relieving film 54 is a dielectric film such as a polyimide, and the intervenient metal 56 is a metal such as copper (Cu) having high electrical and high thermal conductivities. The intervenient metal regions 56 can be formed in the via holes of the stress-relieving film 54 by plating or other methods. As shown in FIG. 11, the stress-relieving film 54 is aligned with and placed on the substrate 20, and the package 10 with its active surface down is aligned and placed on the stress-relieving film 54. A solder ball 36 is on each substrate pad 22 of the substrate 20, and a solder ball 34 is on each ball pad 12 of the package 10. A fixing means for holding the stress-relieving film 54 or an aligning means for aligning the stress-relieving film 54 and the package 10 can be additionally used. In this configuration, the solder balls 34 and 36 respectively are on the upper and the lower surfaces of the intervenient metal regions 56 of the stress-relieving film 54. A reflow process forms the solder joint 30, as shown in FIG. 12. The solder joint structure of FIG. 8 differs from the solder joint 30 of the FIG. 12 in that the solder joint of FIG. 12 includes the intervenient metal region 56 of the stress-relieving film 54. The metal regions 56 of the stress-relieving film 54 more firmly attach to and support the solder joints 30.

The diameter of the intervenient metal 56 depends on the diameter or the height of the solder joint 30. In reflowing the solder balls 34 and 36 to form the solder joints 30 of FIG. 12, the molten solder sticks primarily to the intervenient metals 56 due to the wetability of the solder. Therefore, the solder joint 30 can be easily formed even when the diameter of each intervenient metal region 56 is greater than that of the solder balls 34 and 36. In contrast, when solder extends through the via holes, the diameter of the via hole needs to be a smaller than that of the solder ball (FIG. 6). As described above, the structures and the fabrication methods for the solder joints of chip size packages according to the present invention prevent several problems of the conventional solder joints. Since the stress-relieving film distributes the stress of the solder joints, the probability of the crack in the solder joints is remarkably reduced. This effect is quantified by a test such as a simulation. Table 1 shows result of a simulation of a Temperature Cycling (T/C) test. In Table 1, Plastic Strain represents the degree of the deformation of the solder joints by plastic strain, and Lifetime represents number of Temperature Cycles that the solder joint can withstand. In the simulation, the solder joint contains Pb and Sn in the ratio of 60:40, and the size of the ball pad or the substrate pad is 300 $\mu$m to 400 $\mu$m. The temperature periodically varies between −25° C. to 125° C. As shown in Table 1, compared with the conventional cases (models A, B, C, and D), a model K of the present invention remarkably reduces the plastic strain that causes the cracking of the solder joint. Correspondingly, the lifetime of the solder joint in the Temperature Cycling test was lengthened.

TABLE 1

|  | Conventional Cases | | | Present Invention |
| --- | --- | --- | --- | --- |
|  | Model A | Model B | Model C | Model D | Model K |
| Underfill | without | without | With | With | With |
| Plastic Strain | 0.036~0.042 | 0.032~0.038 | 0~0.012 | 0~0.007 | 0~0.009 |
| Lifetime (cycle) | 50~150 | 100~200 | 1,000 or more | 1,500 or more | 1,200 or more |

The present invention can obtain the same improvements in lifetime that the underfill encapsulation method can obtain. Further, the present invention solves several problems caused by underfill encapsulation. The stress-relieving film does not contact but lies away from the package or the substrate by a designated distance and has a self-elasticity. Therefore, differences in the CTEs of the substrate, the package, and the stress-relieving film do not cause cracking of the chip or the damage of the stress-relieving film. That is, the stress-relieving film without any interfaces with the package or substrate prevents the failure such as the interface delamination caused by underfill encapsulant.

The present invention does not require additional encapsulation processes and thereby reduces the production cost.

Although exemplary embodiments of the present invention have been described in detail hereinabove, those embodiments are described to illustrate rather than limit the scope of the invention. It should be understood that many variations and/or modifications of the basic inventive concepts herein taught fall within the spirit and scope of the present invention as defined in the appended claims.

What is claimed is:

1. A method for manufacturing a semiconductor device, said method comprising:
   (A) providing a package including a plurality of ball pads and a plurality of solder balls formed on respective ball pads;
   (B) providing a substrate including a plurality of substrate pads thereon, each substrate pad corresponding to a respective one of the ball pads;
   (C) positioning a stress-relieving film away from and between the package and the substrate, both of which face to each other at a distance; and
   (D) reflowing the solder balls on the ball pads to form a plurality of solder joints extending through the stress-relieving film, each physically and electrically connecting the corresponding ball pad and the corresponding substrate pad, wherein the stress-relieving film is joined to the plurality of solder joints so as to distribute stress in the solder joints over the stress-relieving film.

2. The method of claim 1, wherein the stress-relieving film comprises a plurality of via holes corresponding to the respective solder joints, and the solder joints are formed through the via holes.

3. The method of claim 2, wherein the substrate further comprises a plurality of solder balls on the respective substrate pads, and the solder joints are formed by reflowing the solder balls on the substrate pads as well as the solder balls on the ball pads.

4. The method of claim 3, wherein the step (C) comprises:
   placing the stress-relieving film above the substrate so that each solder ball of the substrate pad is aligned with the corresponding one of the via holes; and
   placing the package above the stress-relieving film so that each solder ball pad is aligned with the corresponding one of the via holes.

5. The method of claim 2, wherein the step (C) comprises:
   holding the stress-relieving film so that the stress-relieving film lies away from the substrate by a designated distance and each substrate pad is aligned with the corresponding one of the via holes; and
   placing the package on the stress-relieving film with each of the solder balls on the ball pads aligned with the corresponding one of the via holes.

6. The method of claim 1, wherein the stress-relieving film comprises a plurality of metal regions corresponding to the plurality of solder joints, and reflowing the solder balls attaches each solder ball to the corresponding metal region.

7. The method of claim 6, wherein the substrate comprises a plurality of solder balls on the respective substrate pads, and reflowing the solder balls on the substrate pads and the solder balls on the ball pads attaches the solder balls to the metal regions and forms the solder joints.

8. The method of claim 7, wherein the step (C) comprises:
   placing the stress-relieving film on the substrate with each of the solder balls of the substrate pads aligned with a corresponding one of the metal regions; and
   placing the package on the stress-relieving film with each of the solder balls of the ball pads aligned with a corresponding one of the metal regions.

9. The method of claim 2, wherein the stress-relieving film has a low Coefficient of Thermal Expansion (CTE) and a high elastic coefficient.

10. The method of claim 9, wherein the stess-relieving film is formed from a polyimide material.

11. A method for manufacturing a semiconductor device, said method comprising:
   (A) providing a package including a plurality of ball pads and a plurality of solder balls formed on respective ball pads, each solder ball containing a quantity of solder;
   (B) providing a substrate including a plurality of substrate pads thereon, each substrate pad corresponding to a respective one of the ball pads;
   (C) positioning a stress-relieving film between and separated from the package and the substrate; and
   (D) reflowing the solder balls on the ball pads to form a plurality of solder joints extending through the stress-relieving film, thereby physically and electrically connecting the corresponding ball pad and the corresponding substrate pad,
   wherein the stress-relieving film is joined to the plurality of solder joints so as to distribute stress in the solder joints over the stress-relieving film, and
   further wherein each solder joint is formed substantially completely from the quantity of solder contained in the corresponding solder ball.

12. A method for manufacturing a semiconductor device, said method comprising:
   (A) providing a package including a plurality of ball pads and a plurality of solder balls formed on respective ball pads, each solder ball containing a first quantity of solder;
   (B) providing a substrate including a plurality of substrate pads thereon, each substrate pad having a solder ball formed thereon containing a second quantity of solder and corresponding to a respective one of the ball pads and;
   (C) positioning a stress-relieving film between and separated from the package and the substrate; and
   (D) reflowing the solder balls on the ball pads and the substrate pads to form a plurality of solder joints extending through the stress-relieving film, thereby physically and electrically connecting the corresponding ball pad and the corresponding substrate pad, wherein the stress-relieving film is joined to the plurality of solder joints so as to distribute stress in the solder joints over the stress-relieving film, and further wherein each solder joint is formed substantially completely from the first quantity and the second quantity of solder contained in corresponding solder balls.

* * * * *